(12) United States Patent
Zhou et al.

(10) Patent No.: US 7,148,696 B2
(45) Date of Patent: Dec. 12, 2006

(54) ELECTRICAL SWITCHING APPARATUS AND METHOD INCLUDING FAULT DETECTION EMPLOYING ACOUSTIC SIGNATURE

(75) Inventors: Xin Zhou, Brookfield, WI (US); Jerome K. Hastings, Sussex, WI (US); Joseph C. Zuercher, Brookfield, WI (US)

(73) Assignee: Eaton Corporation, Cleveland, OH (US)

( * ) Notice: Subject to any disclaimer, the term of this patent is extended or adjusted under 35 U.S.C. 154(b) by 171 days.

(21) Appl. No.: 11/034,425

(22) Filed: Jan. 12, 2005

(65) Prior Publication Data

US 2006/0164097 A1    Jul. 27, 2006

(51) Int. Cl.
  *G01R 31/28*    (2006.01)
(52) U.S. Cl. .................. 324/527; 324/528; 324/529
(58) Field of Classification Search ............... 324/527, 324/528, 529
  See application file for complete search history.

(56) References Cited

U.S. PATENT DOCUMENTS

| | | | |
|---|---|---|---|
| 4,165,482 A | 8/1979 | Gale | |
| 4,316,139 A | 2/1982 | Root | |
| 4,884,034 A * | 11/1989 | Guzman | 324/529 |
| 5,224,006 A | 6/1993 | MacKenzie et al. | |
| 5,341,191 A | 8/1994 | Crookston et al. | |
| 5,352,984 A | 10/1994 | Piesinger | |
| 5,521,840 A | 5/1996 | Bednar | |
| 5,530,364 A * | 6/1996 | Mashikian et al. | 324/529 |
| 5,608,328 A | 3/1997 | Sanderson | |
| 5,691,869 A | 11/1997 | Engel et al. | |
| 5,805,399 A | 9/1998 | Pacholok | |
| 6,215,408 B1 | 4/2001 | Leonard et al. | |
| 6,522,228 B1 | 2/2003 | Wellner et al. | |
| 6,522,509 B1 | 2/2003 | Engel et al. | |
| 6,542,056 B1 | 4/2003 | Nerstrom et al. | |
| 6,625,550 B1 | 9/2003 | Scott et al. | |
| 6,707,652 B1 | 3/2004 | Engel | |
| 6,710,688 B1 | 3/2004 | Wellner et al. | |
| 6,720,872 B1 | 4/2004 | Engel et al. | |
| 6,734,682 B1 | 5/2004 | Tallman et al. | |
| 6,777,953 B1 | 8/2004 | Blades | |
| 6,798,211 B1 | 9/2004 | Rockwell et al. | |
| 2002/0038199 A1 | 3/2002 | Blemel | |
| 2002/0130668 A1 | 9/2002 | Blades | |
| 2003/0037615 A1 | 2/2003 | Madaras et al. | |
| 2003/0201780 A1 | 10/2003 | Blades | |

OTHER PUBLICATIONS

Maroni, C.-S. et al., "Series Arc Detection in Low Voltage Distribution Switchboard Using Spectral Analysis", International Symposium on Signal Processing and its Applications (ISSPA), 2001, pp. 473-476.

Innovative Dynamics, Inc., "Wire Chafing Sensor", http://www.idiny.com/chafing.html, 2004, 3 pp.

* cited by examiner

*Primary Examiner*—David Vu
(74) *Attorney, Agent, or Firm*—Martin J. Moran

(57) ABSTRACT

A circuit breaker detects a fault, such as an arc fault or glowing contact, of a power circuit. The circuit breaker includes a first lug and a second acoustic lug adapted to be electrically connected to the power circuit. Separable contacts are electrically connected in series between the first lug and the second acoustic lug. An operating mechanism is adapted to open and close the separable contacts. An acoustic sensor is coupled to the second acoustic lug. The acoustic sensor is adapted to sense an acoustic signal from the second acoustic lug. The acoustic signal is operatively associated with the fault of the power circuit. A circuit inputs the sensed acoustic signal and is adapted to detect the fault therefrom.

28 Claims, 7 Drawing Sheets

ELECTRICAL SWITCHING APPARATUS AND METHOD INCLUDING FAULT DETECTION EMPLOYING ACOUSTIC SIGNATURE

BACKGROUND OF THE INVENTION

1. Field of the Invention

This invention relates to electrical switching apparatus and, more particularly, to circuit interrupters, such as, for example, circuit breakers providing fault protection. The invention also relates to methods for detecting faults, such as arc faults and glowing contacts.

2. Background Information

Electrical switching apparatus include, for example, circuit switching devices and circuit interrupters such as circuit breakers, receptacles, contactors, motor starters, motor controllers and other load controllers.

Circuit breakers are generally old and well known in the art. An example of a circuit breaker is disclosed in U.S. Pat. No. 5,341,191. Circuit breakers are used to protect electrical circuitry from damage due to an overcurrent condition, such as an overload condition or a relatively high level short circuit or fault condition. Molded case circuit breakers, for example, include at least one pair of separable contacts which are operated either manually by way of a handle disposed on the outside of the case or automatically by way of an internal trip unit in response to an overcurrent condition. In small circuit breakers, commonly referred to as miniature circuit breakers, used for residential and light commercial applications, such protection is typically provided by a thermal-magnetic trip device. This trip device includes a bimetal, which heats and bends in response to a persistent overcurrent condition. The bimetal, in turn, unlatches a spring powered operating mechanism, which opens the separable contacts of the circuit breaker to interrupt current flow in the protected power system.

Arcing is a luminous discharge of electricity across an insulating medium, usually accompanied by the partial volatilization of electrodes. An arc fault is an unintentional arcing condition in an electrical circuit. Arc faults can be caused, for instance, by worn insulation between adjacent bared conductors, by exposed ends between broken conductors, by faulty electrical connections, and in other situations where conducting elements are in close proximity. Arc faults in systems can be intermittent since the magnetic repulsion forces generated by the arc current force the conductors apart to extinguish the arc. Mechanical forces then bring the conductors together again in order that another arc is struck.

During sporadic arc fault conditions, the overload capability of the circuit breaker will not function since the root-mean-squared (RMS) value of the fault current is too small to activate the automatic trip circuit. The addition of electronic arc fault sensing to a circuit breaker adds one of the elements required for sputtering arc fault protection— ideally, the output of an electronic arc fault sensing circuit directly trips and, thus, opens the circuit breaker. See, for example, U.S. Pat. Nos. 6,710,688; 6,542,056; 6,522,509; 6,522,228; 5,691,869; and 5,224,006, which deal with DC and AC arc fault detection. See, also, U.S. Pat. No. 6,720,872, which deals with a receptacle.

Known technology for arc fault detection may employ a current signature. The problems associated with this methodology include false arc fault current signature detection from some electrical loads. Also, there are variations in the arc fault that depend on how the arc fault is created including, for example, its immediate environment.

A glowing contact is a high resistance connection, which can form at the interface of a copper wire and a screw terminal, for example, of a receptacle. The resulting temperature rise at this connection point can melt the wire's insulation and damage the receptacle. High resistance connections, such as cause glowing contacts, are most typically "behind the wall" and, thus, are hidden. Hence, it is desirable to be able to detect this condition and interrupt the current before the glowing contact fault progresses to a hazardous condition. See, for example, U.S. Pat. No. 6,707,652.

U.S. Pat. No. 5,608,328 discloses that widespread methods for precisely locating faults in power cables are based on acoustic detection of an arc at the fault. Typically, a surge generator or "thumper" is used to excite the power cable with a series of high-energy pulses which, in turn, prompt audible sparking and vibration at the fault.

U.S. Pat. No. 5,608,328 discloses that a series arc, once formed, tends to grow in length by reason of the thermal and electrochemical action of the arc. The arc literally erodes the adjacent contacts thereby assuring, absent human intervention, that the once marginal "opening" will become a full-fledged gap. This gap will continue to sustain an arc for hours or even months until it grows beyond an arc-sustaining maximum. During such periods, electrical and acoustic noise will be produced by the arc. Further, substantial energy will be generated by reason of the volt-amp product associated with the gap/arc which must be dissipated in order to maintain temperatures within safe limits. The arc is detected by detectors that receive electrical radio frequency (RF) noise.

U.S. Pat. No. 6,734,682 discloses a portable arc fault locating and testing device that employs an ultrasonic pick-up coil and an ultrasonic detector in combination with an audible pick-up coil and an audible detector. A circuit determines the correlation between the ultrasonic sound and the audible sound characteristics of an arc fault.

U.S. Pat. No. 6,777,953 discloses a system for locating parallel arcing faults in a set of wires. The system includes a handheld ultrasonic monitor to measure and indicate the distance from the operator to the arc. It measures both the electromagnetic pulse from the arc and the ultrasonic emission from the arc and uses the difference in arrival times to calculate the distance to the arc.

U.S. Pat. No. 6,798,211 discloses a fault distance indicator that locates a fault in a power line by modeling pulses of reflected traveling wave signals which are generated from electrical arcs that occur as a result of the fault. The fault distance indicator is mounted directly on a power line within a transformer enclosure, is powered by a power signal obtained from a transformer secondary and includes a transceiver, such as an infrared transceiver, although radio frequency or ultrasonic transceivers may be used.

U.S. Patent Application Publication No. 2003/0037615 discloses the generation and detection of acoustic guided waves to evaluate the condition of insulation on electrical wiring. For example, suitable transmitter and receiver transducers are broadband acoustic emission piezoelectric transducers.

The web site at http://www.idiny.com/chafing.html states that a wire chafing sensor is a passive solution to the problem of wire chafing detection by listening to noise signatures in the wire. This also states that the system can detect wire chafing, arcing and burning, and that pattern recognition software categorizes degrees of chafing.

There is room for improvement in electrical switching apparatus, such as, for example, arc fault circuit breakers and receptacles, and in methods for detecting arc faults and glowing contacts.

SUMMARY OF THE INVENTION

These needs and others are met by the present invention, which employs an acoustic signature generated by an arc fault or a glowing contact to detect a fault. An acoustic sensor "listens" directly to signature noise generated by a fault, no matter what type of electrical load is present or in what kind of environment in which the fault is generated.

The acoustic noise generated by an arc fault or a glowing contact has an acoustic signal at one or more specific wavelengths that is (are) directly related to either the basic characteristics of, for example, the arc and its resonance frequency or the AC power source modulated frequency and its harmonics. The acoustic signal of an arc fault is detected by an acoustic sensor. The resulting signal may be a trip signal, which is sent to a trip mechanism to, for example, trip open separable contacts, in order to interrupt the arc fault.

In accordance with one aspect of the invention, an electrical switching apparatus for detecting a fault of a power circuit comprises: a first lug; a second acoustic lug adapted to be electrically connected to the power circuit; separable contacts electrically connected in series between the first lug and the second acoustic lug; an operating mechanism adapted to open and close the separable contacts; an acoustic sensor coupled to the second acoustic lug, the acoustic sensor being adapted to sense an acoustic signal from the second acoustic lug, the acoustic signal being operatively associated with the fault of the power circuit; and a circuit inputting the sensed acoustic signal and being adapted to detect the fault therefrom.

The fault may be a glowing contact or an arc fault. The arc fault may be a parallel arc fault or a series arc fault.

The electrical switching apparatus may be an arc fault circuit interrupter. The operating mechanism may comprise a trip mechanism, and the circuit may output a trip signal to the trip mechanism upon detecting the arc fault from the sensed acoustic signal.

The second acoustic lug may be adapted to couple the acoustic signal from the power circuit to the acoustic sensor.

The second acoustic lug may include a voltage adapted to be electrically output to the power circuit. The second acoustic lug may comprise an electrical insulator adapted to electrically insulate the acoustic sensor from the voltage. The second acoustic lug may comprise an acoustic insulator adapted to insulate the acoustic sensor from airborne noise.

As another aspect of the invention, a method of detecting a fault in a power circuit comprises: employing an acoustic lug adapted to be electrically connected to the power circuit; coupling an acoustic sensor to the acoustic lug; sensing an acoustic signal from the acoustic lug with the acoustic sensor, the acoustic signal being operatively associated with the fault of the power circuit; and inputting the sensed acoustic signal and detecting the fault therefrom.

The method may comprise employing as the power circuit a direct current power circuit; detecting the fault in the direct current power circuit; sensing a current flowing between the acoustic lug and the power circuit; filtering the sensed current; determining a first arc fault condition from the filtered sensed current; determining a second arc fault condition from the sensed acoustic signal; and asserting a trip signal responsive to the first arc fault condition being substantially concurrent with the second arc fault condition and, alternatively, discarding the sensed acoustic signal and the sensed current and re-sensing the acoustic signal and the current flowing between the acoustic lug and the power circuit.

The method may input the sensed acoustic signal to a band pass filter; output a filtered signal from the band pass filter; and analyze the filtered signal to detect a continuous acoustic signal at about a predetermined frequency.

The method may further comprise employing as the power circuit an alternating current power circuit; and detecting the fault in the alternating current power circuit.

The method may determine a frequency of the power circuit or at least one harmonic or at least one sub-harmonic of the frequency; band pass filter the sensed acoustic signal to determine a filtered signal; and determine if a summation of acoustic signal intensities at the frequency of the power circuit or the at least one harmonic or the at least one sub-harmonic exceeds a predetermined amount.

The method may determine an absolute value of the sensed acoustic signal; and employ a fast Fourier transform of the absolute value to determine the frequency or the at least one harmonic or the at least one sub-harmonic.

The method may assert a trip signal if the summation of acoustic signal intensities at the frequency of the power circuit or the at least one harmonic or the at least one sub-harmonic exceeds the predetermined amount; and alternatively, discard the sensed acoustic signal and re-sense the acoustic signal.

The method may further comprise analyzing the sensed acoustic signal to detect acoustic wavelets and to determine duration of a half cycle of the current; and determining if time durations measured between successive pairs of the acoustic wavelets during a predetermined time period match multiples of the duration of the half cycle of the current.

The method may determine the match and assert a trip signal and, alternatively, discard the sensed acoustic signal and re-sense the acoustic signal.

The method may determine a frequency of the power circuit or at least one harmonic or at least one sub-harmonic of the frequency; band pass filter the sensed acoustic signal to determine a filtered signal; determine if a summation of acoustic signal intensities at the frequency of the power circuit or the at least one harmonic or the at least one sub-harmonic exceeds a predetermined amount and responsively assert a first signal; analyze the sensed acoustic signal to detect acoustic wavelets and to determine duration of a half cycle of the current; determine if time durations measured between successive pairs of the acoustic wavelets during a predetermined time period match multiples of the duration of the half cycle and responsively assert a second signal; and assert a trip signal responsive to the first signal or the second signal.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

As employed herein, the term "acoustic" shall expressly include, but not be limited by, one or more sounds that are subsonic, sonic and/or ultrasonic.

As employed herein, the term "lug" shall expressly include, but not be limited by, a terminal or other electrically conductive fitting to which one or more electrical wires or other electrical conductors are electrically and mechanically connected.

The present invention is described in association with an arc fault circuit breaker, although the invention is applicable to a wide range of electrical switching apparatus.

Figure 1:
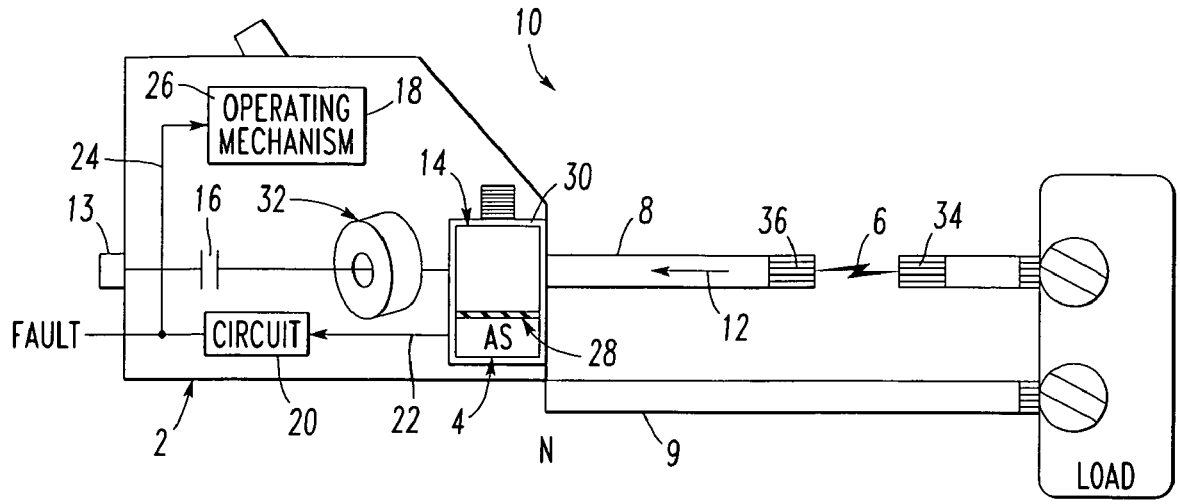
FIG. 1 is a block diagram of a circuit breaker employing an acoustic sensor to detect a series arc fault condition in accordance with the present invention.

FIG. 1 shows an electrical switching apparatus, such as a circuit breaker 2, employing a suitable acoustic sensor 4, such as a piezo electrical sensor, to detect a fault, such as a series arc fault condition 6, in an electrical conductor 8 of a power circuit 10. Here, an electrical conductor-conducted acoustic signal 12 from the series arc fault condition 6 is sensed by the acoustic sensor 4, in order to provide acoustic series arc fault detection, as will be described. The acoustic signal 12 is operatively associated with the power circuit series arc fault condition 6.

The acoustic sensor 4 is suitably coupled to the electrical conductor 8 in order to "listen" for conducted sound. The circuit breaker 2 includes a first lug, such as a line terminal 13, and a second acoustic lug 14, such as a load terminal. The second acoustic lug 14 is adapted to be electrically connected to the power circuit electrical conductor 8, as shown. The circuit breaker 2 also includes separable contacts 16 electrically connected in series between the line terminal 13 and the acoustic lug 14, and an operating mechanism 18 adapted to open and close the separable contacts 16. The acoustic sensor 4 is suitably coupled to the acoustic lug 14 and is adapted to sense the acoustic signal 12 from the acoustic lug 14. The circuit breaker 2 further includes a circuit 20 inputting a sensed acoustic signal 22 from the acoustic sensor 4. The circuit 20 is adapted to output a detected fault signal 24 therefrom, as will be described.

Although the example power circuit 10 includes a neutral conductor 9 (N), the invention is applicable to power circuits which do not employ a neutral conductor and to electrical switching apparatus that receive or do not receive the neutral conductor 9.

EXAMPLE 1

The circuit breaker 2 may be, for example, an arc fault circuit interrupter. The operating mechanism 18 may include a trip mechanism 26, and the circuit 20 may output the detected fault signal 24 as a trip signal to the trip mechanism 26 upon detecting the arc fault 6 from the sensed acoustic signal 22.

EXAMPLE 2

The example acoustic lug 14 is preferably structured to match the acoustic wave-guide provided by the electrical conductor 8. The acoustic lug 14 preferably includes suitable acoustic wave-guide properties that couple the acoustic signal 12 from the power circuit 10 to the acoustic sensor 4.

EXAMPLE 3

The acoustic lug 14 includes a voltage (e.g., a line voltage from the terminal 13) adapted to be electrically output to the power circuit 10. The acoustic lug 14 preferably includes a suitable electrical insulator 28 (e.g., a relatively thin insulating polymer or ceramic) adapted to electrically insulate the acoustic sensor 4 from the voltage.

EXAMPLE 4

The acoustic lug 14 preferably includes a suitable acoustic insulator 30 (e.g., without limitation, an acoustic insulation foam pad wrapped around the acoustic lug 14 and the acoustic sensor 4), such as a suitable mount and suitable acoustic insulation, adapted to insulate the acoustic sensor 4 from airborne noise.

EXAMPLE 5

In this example, the circuit breaker 2 also includes a current sensor 32, which may be employed, as is discussed below in connection with FIG. 3 or 4, or which need not be employed, as is discussed below in connection with FIG. 5. For example, the use of the current sensor 32 in FIG. 4 is employed to identify electric power source frequency when the power circuit 10 is an AC power circuit. This current sensor 32 may not be needed since, most typically, the AC power frequency is known.

As will be discussed, below, in connection with FIGS. 3–5, the circuit breaker 2 measures the acoustic signature generated by a fault, such as the series arc fault 6 of FIG. 1, to detect the same. This acoustic signature sensing technique will generally not experience a false output due to electrical current, since, fortunately, the current flowing through a solid electrical conductor and electrical connections or terminations does not produce an acoustic output. Rather, the acoustic sensor 4 "listens" directly to mechanical noise generated by an electrical fault, such as the series arc fault 6.

EXAMPLE 6

Noise resulting from on/off power switching is generally of relatively short duration and has a specific "shape," due to a relatively short switching time and, also, due to mechanical bounce. Acoustic noise activity at the initiation of the arc fault, such as the series arc fault 6, is due, in part, to mechanical separation of electrical contacts 34,36 in the broken conductor 8 and, thus, is preferably considered to be insufficient to indicate a trip with the detected fault signal 24.

Figure 2:
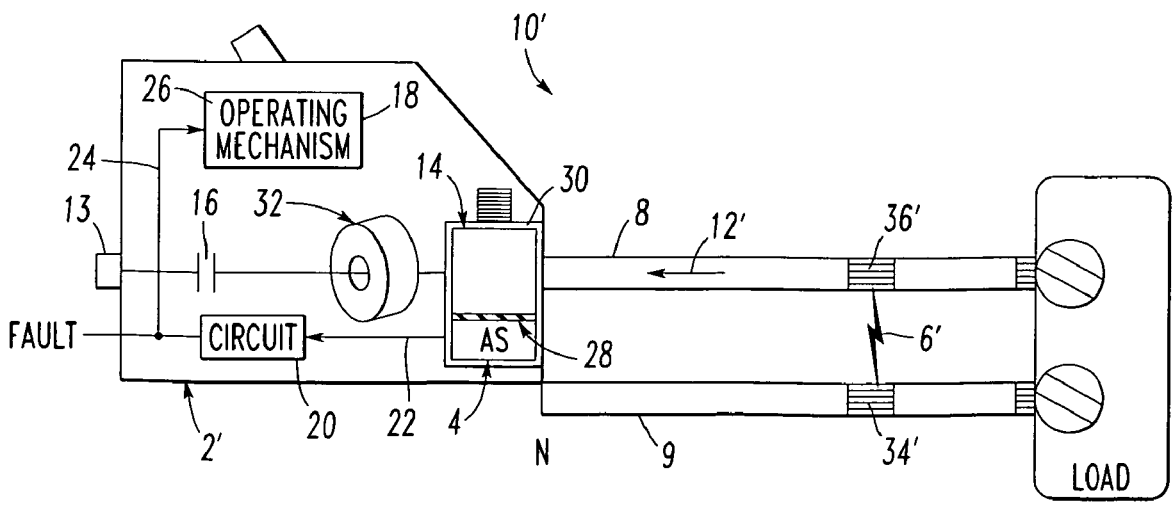
FIG. 2 is a block diagram of a circuit breaker employing an acoustic sensor to detect a parallel arc fault condition in accordance with another embodiment of the invention.

FIG. 2 is a block diagram of a circuit breaker 2', which is the same as or similar to the circuit breaker 2 of FIG. 1. The circuit breaker 2' provides parallel arc fault detection and employs the acoustic sensor 4 to receive an acoustic signal 12', in order to detect a parallel arc fault condition 6' between electrical contacts 34',36' arising from, for example, worn or broken insulation (not shown) of the power circuit 10'. Otherwise, there need be no difference in the structure of the circuit breakers 2,2' of FIGS. 1 and 2 or the algorithms of FIGS. 3–6 for parallel or series arc fault detection.

Figure 3:
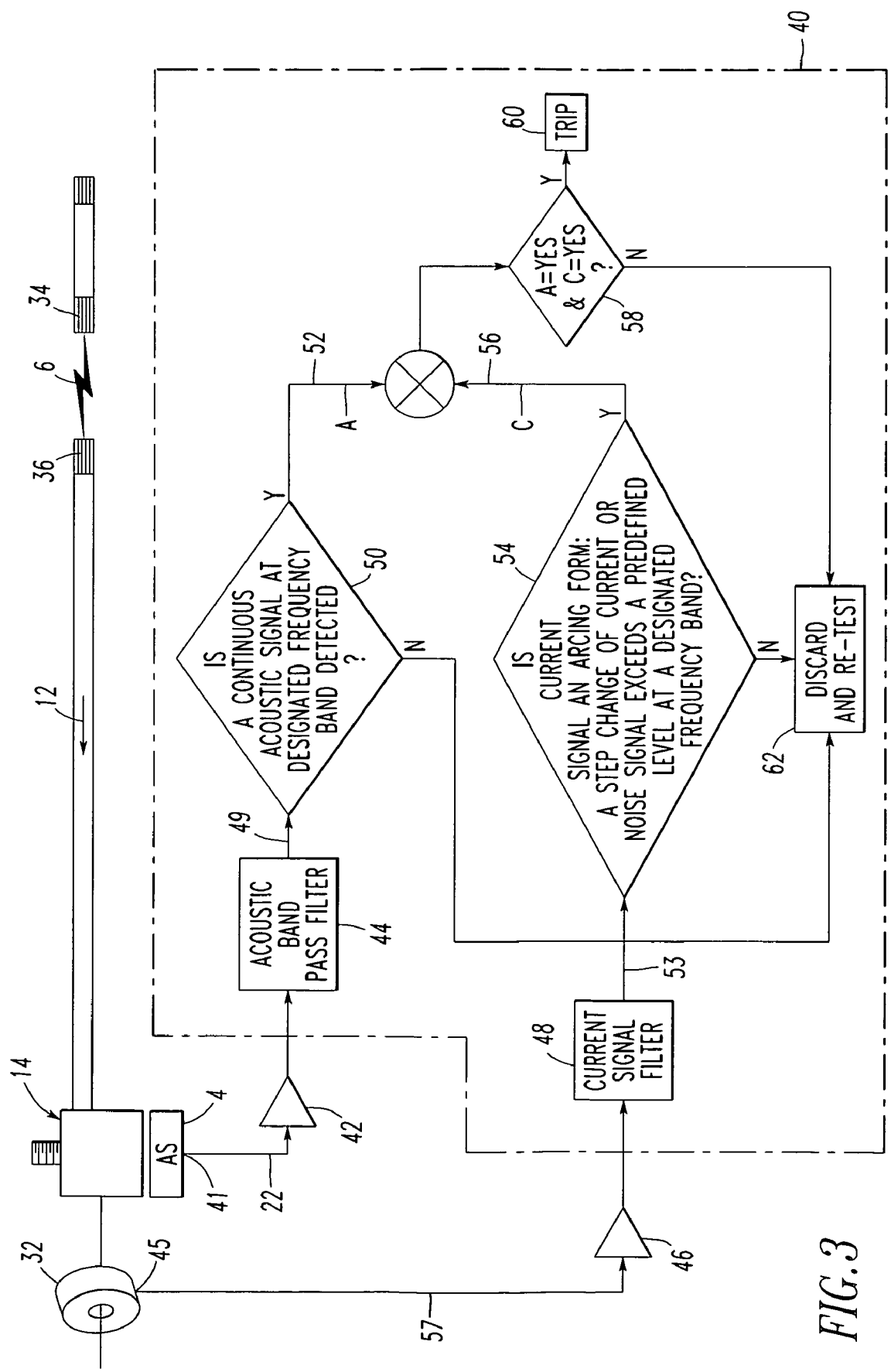
FIG. 3 is a flowchart of an acoustic direct current (DC) arc fault detection algorithm suitable for use by the circuit breakers of FIG. 1 or 2 in accordance with another embodiment of the invention.
Figure 4:
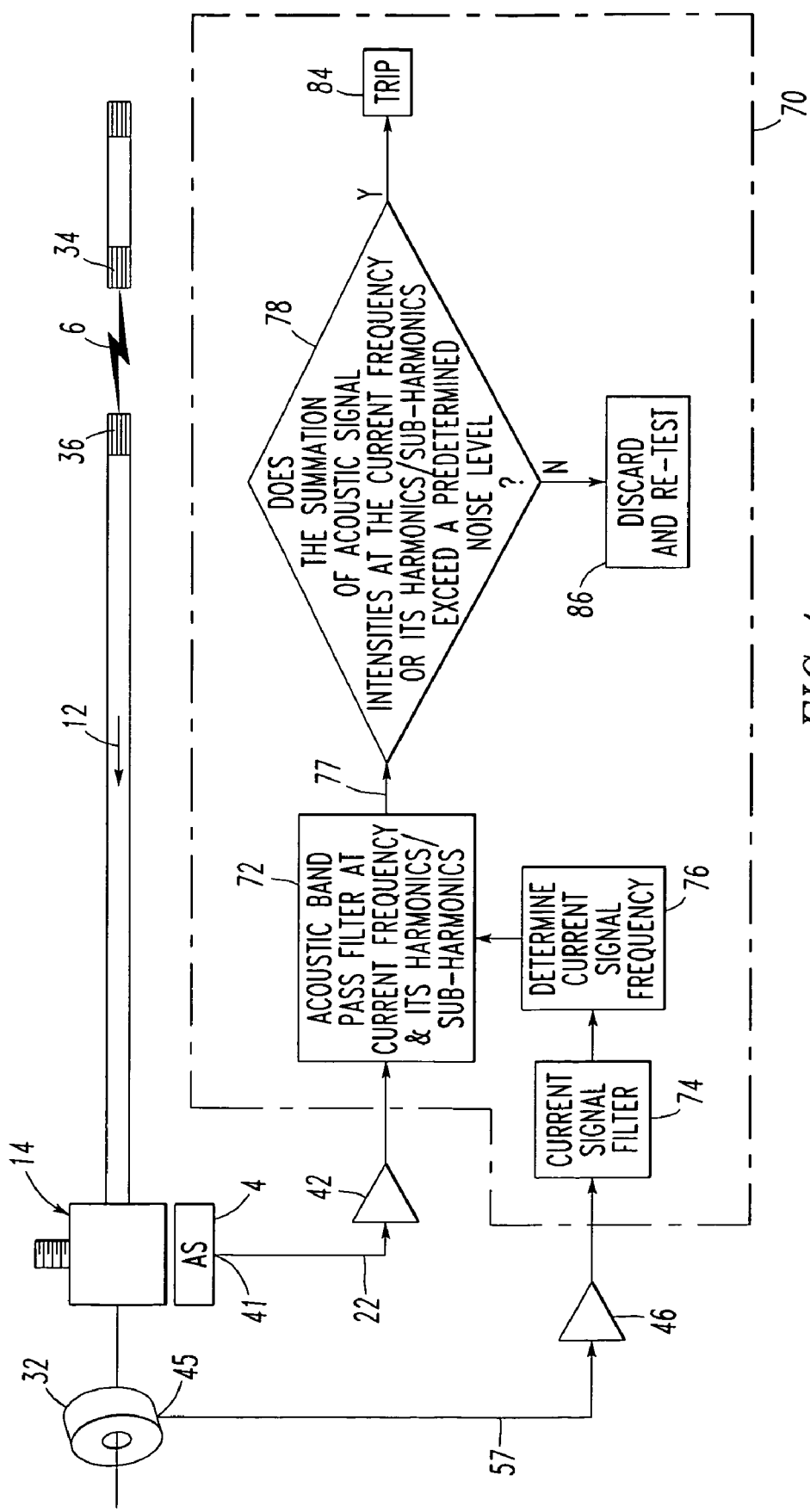
FIG. 4 is a flowchart of an acoustic alternating current (AC) arc fault detection algorithm suitable for use by the circuit breakers of FIG. 1 or 2 in accordance with another embodiment of the invention.

FIG. 3 is a flowchart of an acoustic direct current (DC) arc fault detection algorithm 40 suitable for use by the circuit breakers 2,2' of FIG. 1 or 2. The output 41 of the acoustic sensor 4 is buffered by a buffer 42 and is, then, input by an acoustic band pass filter 44. The output 45 of the current sensor 32 is buffered by a buffer 46 and is, then, input by a current signal filter 48. The output 49 of the acoustic band pass filter 44 is analyzed, at 50, to determine if a continuous acoustic signal at a predetermined frequency band is detected. If so, then a signal A 52 is asserted. The output 53 of the current signal filter 48 is analyzed, at 54, by conventional arc fault detection techniques. For example, the sensed current signal 57 is an arcing form if a step change of current noise signal exceeds a predetermined level at a predetermined frequency band. If so, then a signal C 56 is asserted. At 58, if both signal A 52 and signal C 56 are true, then a trip signal 60 is asserted. Otherwise, the sensed acoustic signal 22 and the sensed current signal 57 are both discarded at 62 and, then, are re-sampled for a subsequent test.

This algorithm 40 employs a combination of electrical current (e.g., a step detector and, hence is applicable to DC circuits) and the electrical conductor-conducted acoustic indication, such as by employing an "AND" function, at 58, when the two indications of signals 52,56 are coincident in time within a suitable predetermined time interval. This improves performance as measured by minimal nuisance indications and relatively high fault sensitivity.

EXAMPLE 7

The strategy for DC arc fault detection utilizes noise levels in certain frequency regimes and is based on the steady persistence of acoustic activity. In the DC arc fault detection algorithm 40, the acoustic band pass filter 44 is employed at, for example, 12.5 kHz, 25 kHz or 50 kHz and it is determined whether a low level acoustic noise persists for greater than a suitable time (e.g., without limitation, about 0.1 seconds). Also, in order to generate the trip signal 60, the sensed current signal 57 essentially remains in the arcing state. Here, this is determined by the signal C 56 and the sensed current signal 57 is an arcing form since the step change of the current noise signal exceeds a predetermined level at a predetermined frequency band.

FIG. 4 is a flowchart of an acoustic alternating current (AC) arc fault detection algorithm 70 suitable for use by the circuit breakers 2,2' of FIG. 1 or 2. The output 41 of the acoustic sensor 4 is buffered by the buffer 42 and is, then, input by an acoustic band pass filter 72. The output 45 of the current sensor 32 is buffered by the buffer 46 and is, then, input by a current signal filter 74, which determines, at 76, the current signal frequency. That frequency is output to the acoustic band pass filter 72, which is applied at the particular frequency of the sensed current signal 57 and its harmonics and sub-harmonics. The output 77 of the acoustic band pass filter 72 is analyzed, at 78, to determine if the summation of acoustic signal intensities at the current frequency or at its harmonics or sub-harmonics exceeds a predetermined noise level. If so, then a trip signal 84 is asserted. Otherwise, the sensed acoustic signal 22 is discarded and, then, is re-sampled, at 86, for a subsequent test.

In order to distinguish an arc fault, such as the series arc fault 6, from vibration and other mechanical noise, it is possible to utilize the fact that an AC power source modulates the arc fault, thereby providing an acoustic signature that is relatively more unique. In addition, AC glowing contacts (not shown), under many conditions, also express similar modulated noise.

EXAMPLE 8

Figure 7:
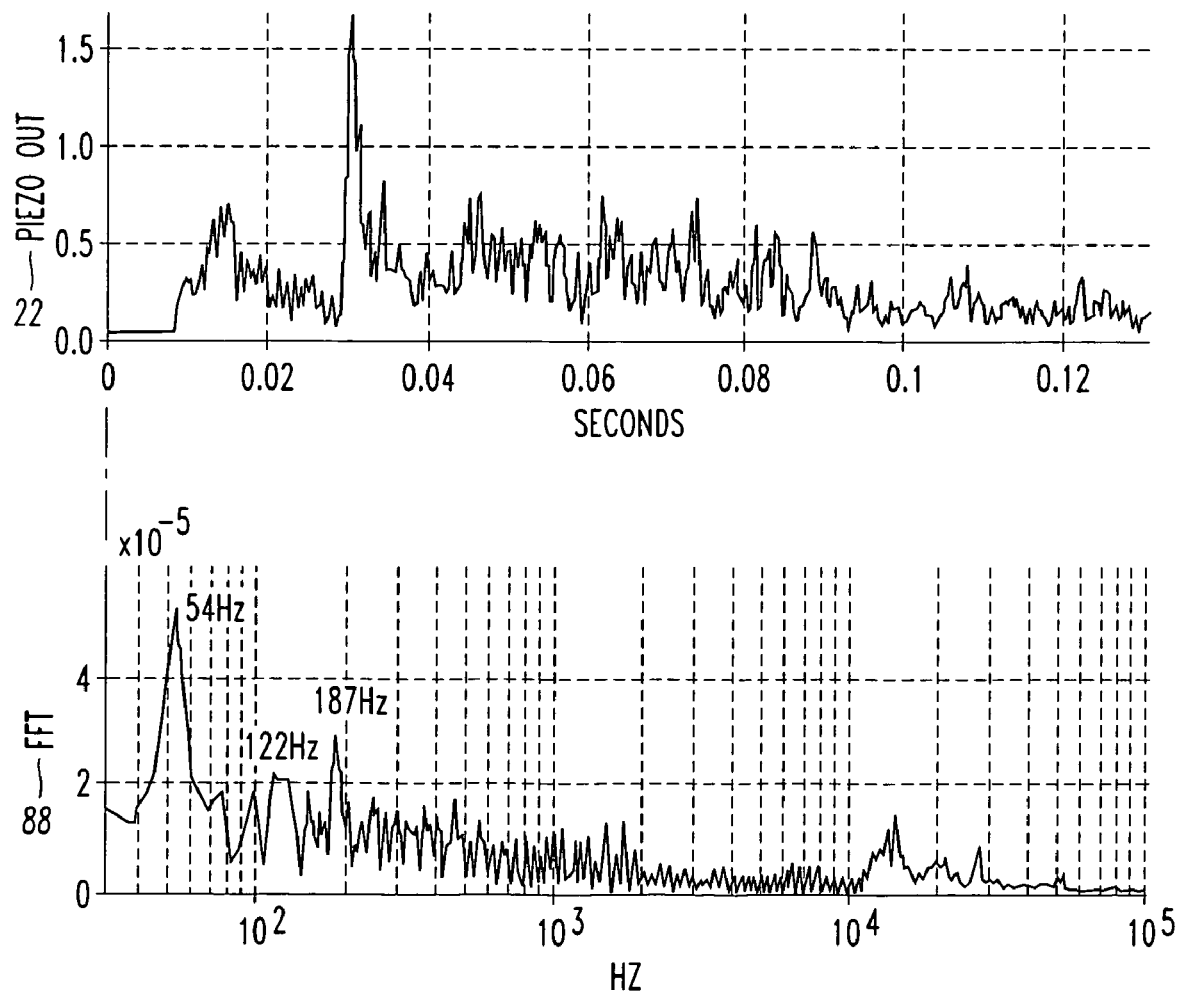
FIG. 7 plots acoustic and absolute value fast Fourier transform (FFT) signals for the algorithm of FIG. 4.

In the frequency-based acoustic AC arc fault detection algorithm 70 of FIG. 4, at 72, a fast Fourier transform (FFT) of the absolute value of the sensed acoustic signal 22 (e.g., absolute value of the sensor output voltage) identifies, for example, 120 Hz and/or its sub-harmonic(s) (e.g., 60 Hz) or harmonics for a 60 Hz power circuit. Example plots of the sensed acoustic signal 22 and absolute value FFT signal 88 are shown in FIG. 7.

EXAMPLE 9

Figure 8:
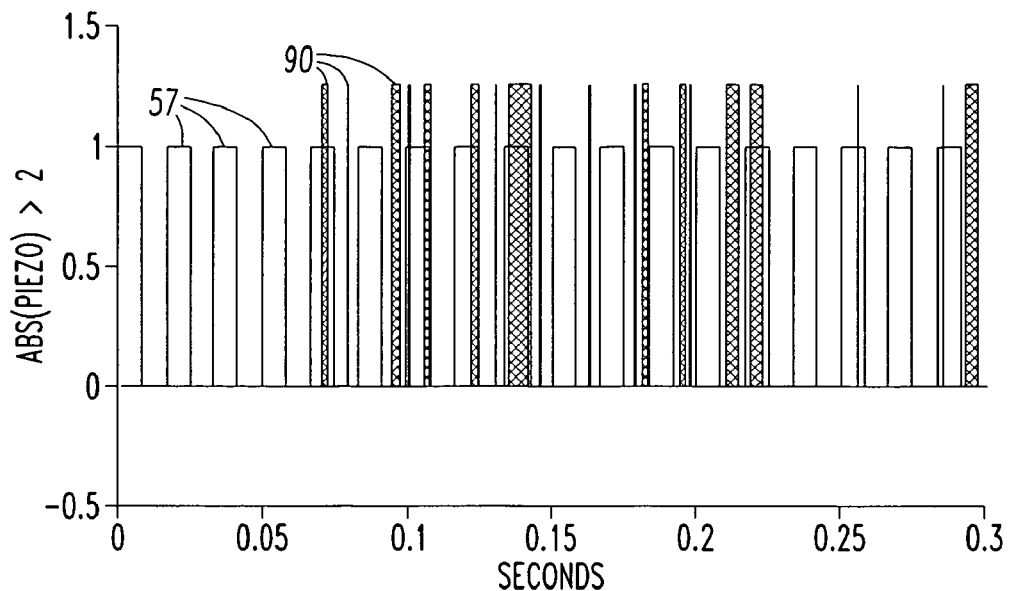
FIG. 8 plots the correlation between a line synchronization signal and the absolute value of the acoustic signal being above a suitable threshold for the algorithm of FIG. 4.

In connection with the frequency-based acoustic AC arc fault detection algorithm 70 of FIG. 4, FIG. 8 shows the correlation between the line synchronization signal from the sensed current signal 57 and the absolute value of the sensed acoustic signal 22 being above a suitable threshold for a series arc fault, such as 6, in connection with, for example, a vacuum cleaner (not shown). The plot 90 indicates when the absolute value of the output voltage of the sensed acoustic signal 22 is above the predetermined threshold. The correlation, although not perfect, is indicated in FIG. 8 and can be verified in the wavelet onset time domain method of FIG. 5.

Figure 5:
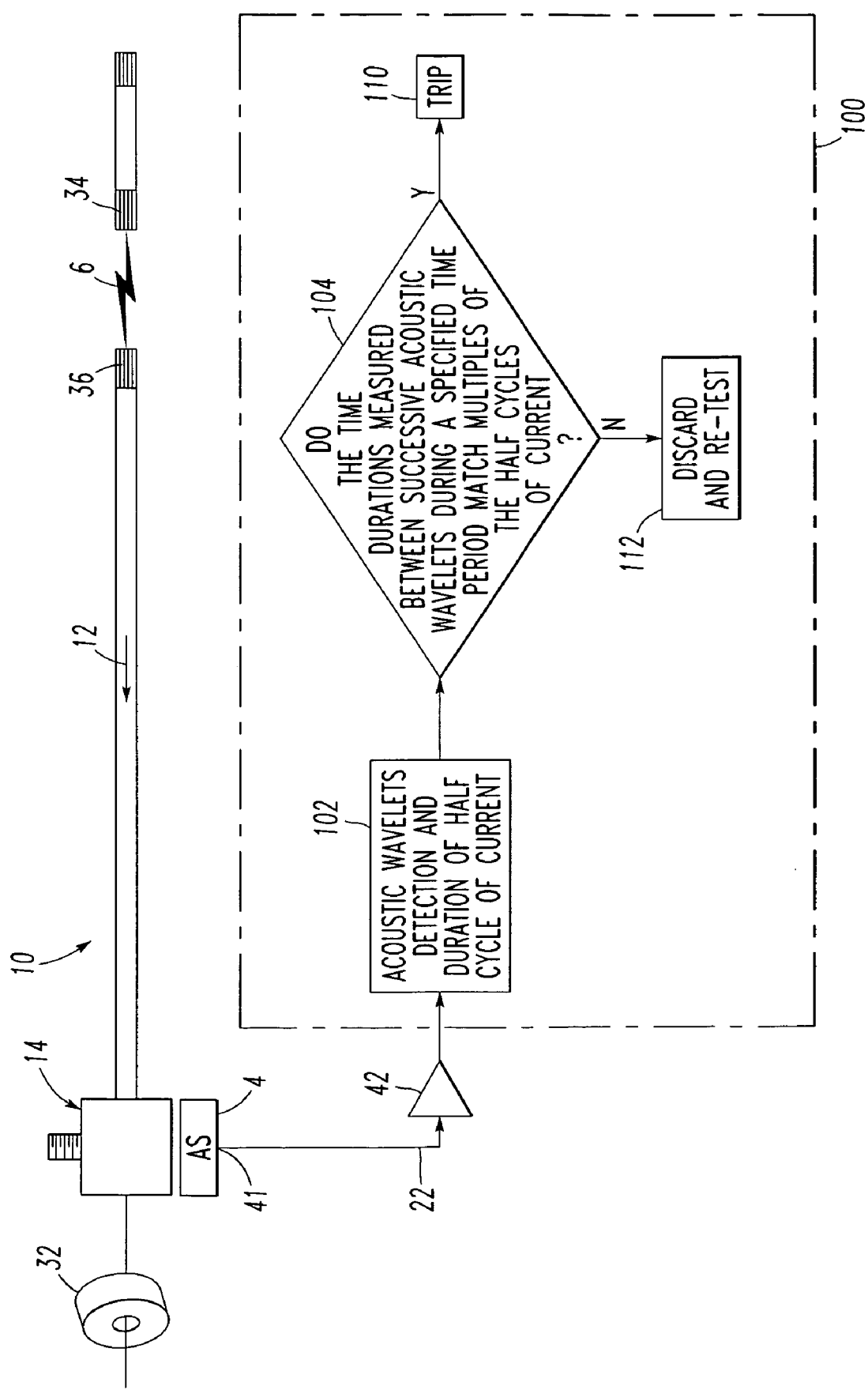
FIG. 5 is a flowchart of another acoustic AC arc fault detection algorithm suitable for use by the circuit breakers of FIG. 1 or 2 in accordance with another embodiment of the invention.

FIG. 5 is a flowchart of another acoustic AC arc fault detection algorithm 100 suitable for use by the circuit breakers 2,2' of FIG. 1 or 2. The output 41 of the acoustic sensor 4 is buffered by the buffer 42 and is, then, analyzed, at 102, to detect acoustic wavelets and the duration of the half cycle of current in the power circuit 10. In this example, the power frequency is a known value. That information is then checked, at 104, to determine if the time durations measured between successive acoustic wavelets during a predetermined time period (e.g., without limitation, about 0.1 second) match multiples of the half cycle duration. This employs, for example, a wavelet onset time domain analysis as is discussed, below, in connection with Example 10 and FIG. 9. The threshold absolute value and the half wave rectified acoustic sensor voltage are employed and the digital output is correlated with drive frequency. If a match is determined, at 104, then a trip signal 110 is asserted. Otherwise, the sensed acoustic signal 22 is discarded and, then, is re-sampled for a subsequent test, at 112.

EXAMPLE 10

Figure 9:
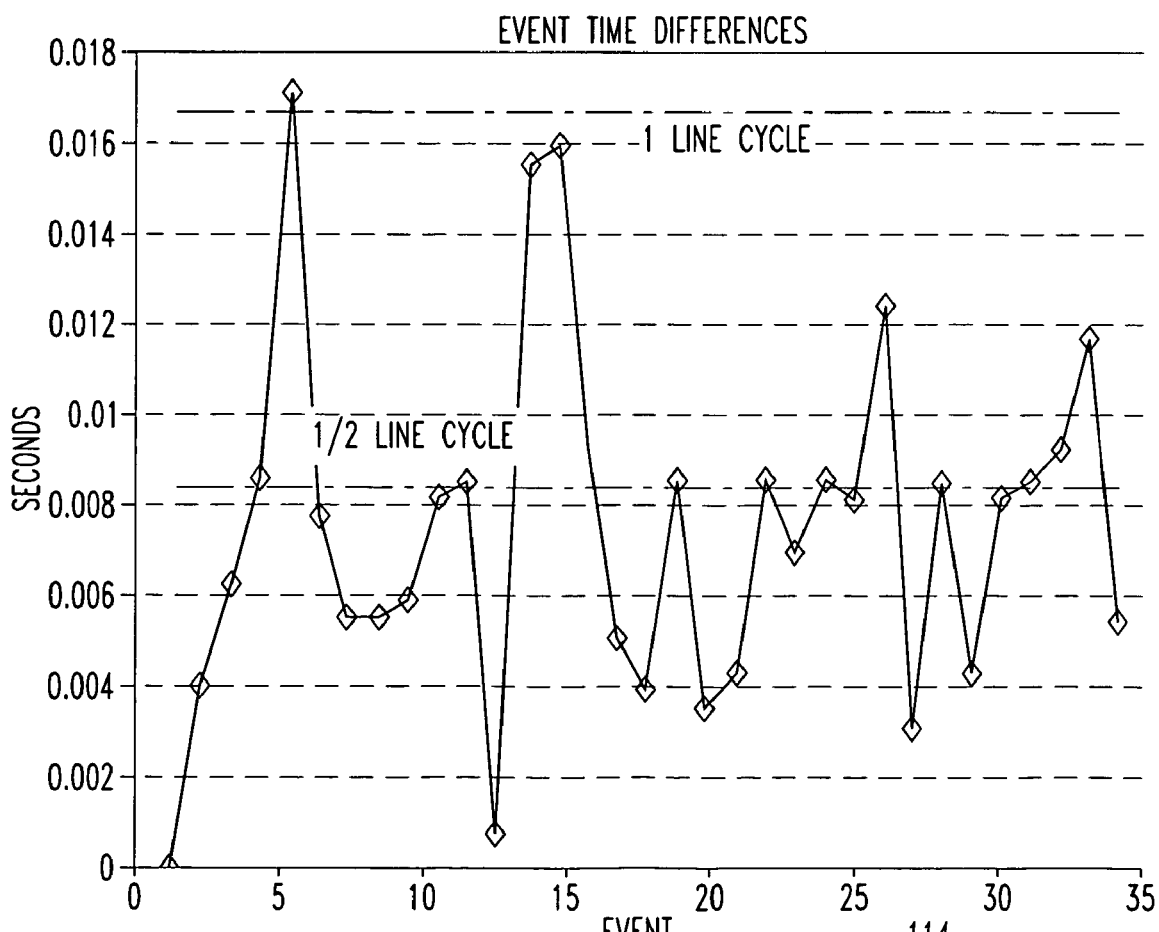
FIG. 9 is a plot of acoustic event to acoustic event time differences for a series arc fault with a vacuum cleaner for the algorithm of FIG. 5.

FIG. 9 shows a plot 114 of acoustic event to acoustic event time differences for a series arc fault, such as 6 of FIG. 1, with, for example, a vacuum cleaner (not shown) for the algorithm 100 of FIG. 5. Here, in this example, the arcing acoustic wavelets duration indicates that ½ line cycle (e.g., 8.33 ms at 60 Hz) and 1 line cycle (e.g., 16.67 ms) acoustic event time differences predominate the event to event measured times.

Figure 6:
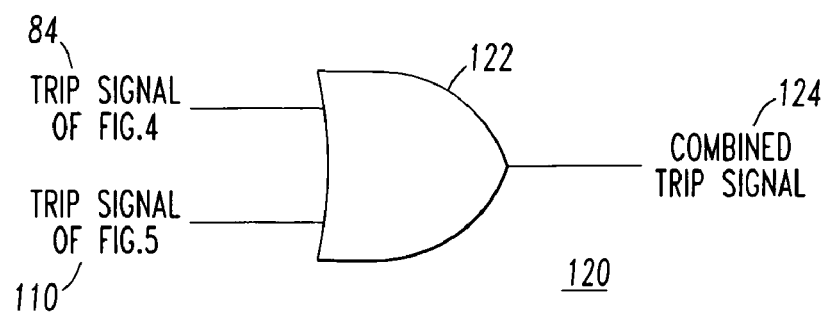
FIG. 6 is a flowchart of a portion of another acoustic AC arc fault detection algorithm suitable for use by the circuit breakers of FIG. 1 or 2 in accordance with another embodiment of the invention.

FIG. 6 is a flowchart of a portion of another acoustic AC arc fault detection algorithm 120 suitable for use by the circuit breakers 2,2' of FIG. 1 or 2. This algorithm 120 employs a combination of the first AC algorithm 70 of FIG. 4 and the second AC algorithm 100 of FIG. 5 by employing an OR function 122 to "OR" the respective trip signals 84,110 to provide a combined trip signal 124.

EXAMPLE 11

The sensed acoustic signal 22 detected by the acoustic sensor 4 of FIGS. 1 and 2 may be employed to output a trip signal, such as 60 of FIG. 3, 84 of FIG. 4, 110 of FIG. 5 and 124 of FIG. 6, to a trip mechanism, such as 26 of FIG. 1, in order to increment an event counter or other device, to produce an alarm, and/or to interrupt a fault, such as the series arc fault 6.

EXAMPLE 12

Although FIGS. 3–5 show the series arc fault 6, they are also equally applicable to the parallel arc fault 6' of FIG. 2.

EXAMPLE 13

Figure 10:
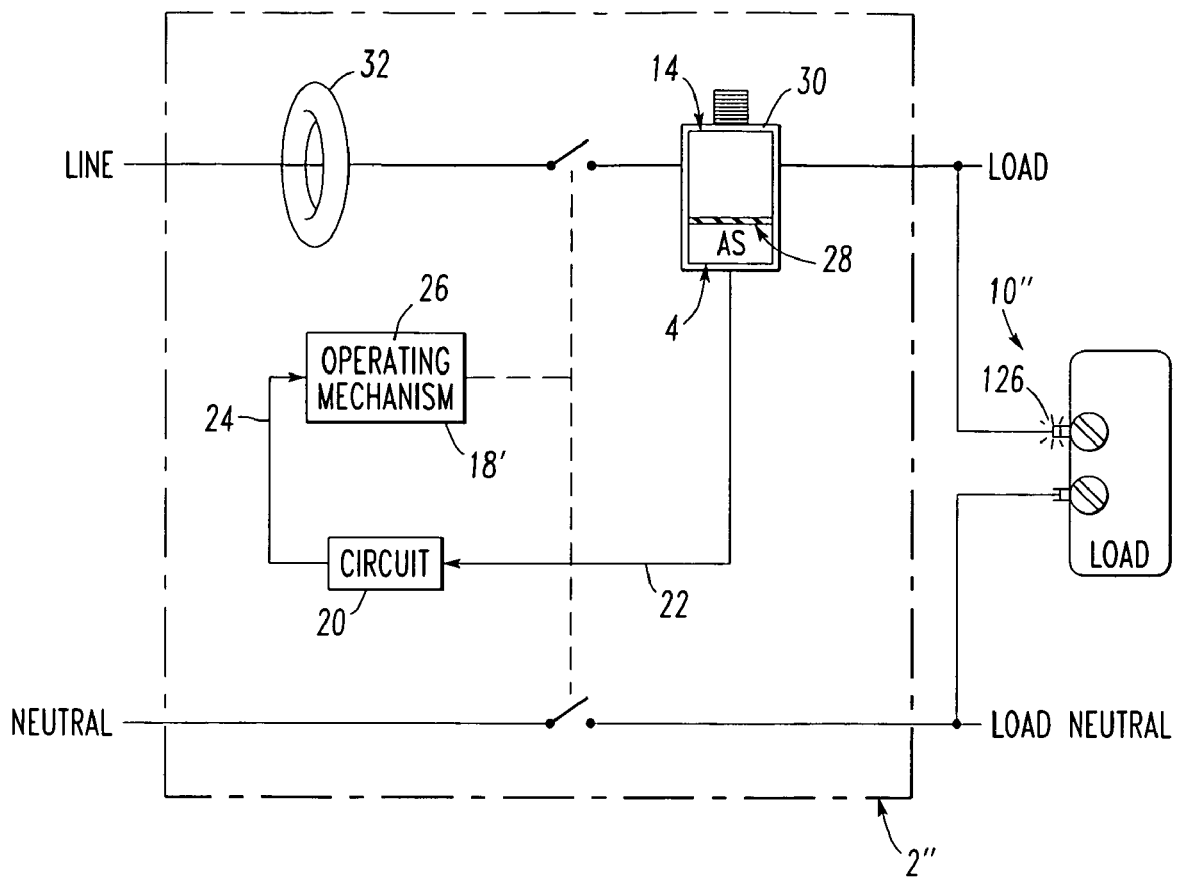
FIG. 10 is a block diagram of a receptacle employing an acoustic sensor to detect a glowing contact in accordance with another embodiment of the invention.

Although examples including the arc faults 6,6' are disclosed in FIGS. 1–5, the invention is also applicable to glowing contacts. For example, the methods for glowing contacts are the same as those for arc fault detection in AC circuits as were discussed above in connection with FIGS. 4–6. FIG. 10 shows a receptacle 2" including an operating mechanism 18', the acoustic sensor 4 and the circuit 20 employing one of the algorithms 40,70,100 to detect a glowing contact 126 of a power circuit 10".

EXAMPLE 14

If the glowing contact were in the load neutral, then there are two possible solutions. First, if there is a glowing contact, then there is current flow, the power cable is connected and the acoustic signal will be conducted through the load to the acoustic sensor 4. Alternatively, another acoustic sensor (not shown) may be attached to the neutral for acoustic sensing.

It will be appreciated that the circuit 20 and the algorithms 40,70,100 disclosed herein may be implemented by analog, digital and/or processor-based circuits.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. An electrical switching apparatus for detecting a fault of a power circuit, said electrical switching apparatus comprising:
    a first lug;
    a second acoustic lug adapted to be electrically connected to said power circuit;
    separable contacts electrically connected in series between said first lug and said second acoustic lug;
    an operating mechanism adapted to open and close said separable contacts;
    an acoustic sensor coupled to said second acoustic lug, said acoustic sensor being adapted to sense an acoustic signal from said second acoustic lug, said acoustic signal being operatively associated with the fault of said power circuit; and
    a circuit inputting said sensed acoustic signal and being adapted to detect said fault therefrom.

2. The electrical switching apparatus of claim 1 wherein said fault is a glowing contact.

3. The electrical switching apparatus of claim 1 wherein said fault is an arc fault.

4. The electrical switching apparatus of claim 3 wherein said arc fault is a parallel arc fault.

5. The electrical switching apparatus of claim 3 wherein said arc fault is a series arc fault.

6. The electrical switching apparatus of claim 3 wherein said electrical switching apparatus is an arc fault circuit interrupter; wherein said operating mechanism comprises a trip mechanism; and wherein said circuit outputs a trip signal to said trip mechanism upon detecting said arc fault from said sensed acoustic signal.

7. The electrical switching apparatus of claim 1 wherein said second acoustic lug is adapted to couple said acoustic signal from said power circuit to said acoustic sensor.

8. The electrical switching apparatus of claim 1 wherein said second acoustic lug includes a voltage adapted to be electrically output to said power circuit; and wherein said second acoustic lug comprises an electrical insulator adapted to electrically insulate said acoustic sensor from said voltage.

9. The electrical switching apparatus of claim 1 wherein said second acoustic lug comprises an acoustic insulator adapted to insulate said acoustic sensor from airborne noise.

10. The electrical switching apparatus of claim 1 wherein said acoustic sensor is a piezo electrical sensor.

11. The electrical switching apparatus of claim 1 wherein said electrical switching apparatus is a receptacle.

12. A method of detecting a fault in a power circuit, said method comprising:
    employing an acoustic lug adapted to be electrically connected to said power circuit;
    coupling an acoustic sensor to said acoustic lug;
    sensing an acoustic signal from said acoustic lug with said acoustic sensor, said acoustic signal being operatively associated with the fault of said power circuit; and
    inputting said sensed acoustic signal and detecting said fault therefrom.

13. The method of claim 12 further comprising
    employing as said power circuit a direct current power circuit;
    detecting said fault in said direct current power circuit;
    sensing a current flowing between said acoustic lug and said power circuit;
    filtering said sensed current;
    determining a first arc fault condition from said filtered sensed current;

determining a second arc fault condition from said sensed acoustic signal; and asserting a trip signal responsive to said first arc fault condition being substantially concurrent with said second arc fault condition and, alternatively, discarding said sensed acoustic signal and said sensed current and re-sensing said acoustic signal and said current flowing between said acoustic lug and said power circuit.

14. The method of claim 13 further comprising inputting said sensed acoustic signal to a band pass filter;
outputting a filtered signal from said band pass filter; and
analyzing said filtered signal to detect a continuous acoustic signal at about a predetermined frequency.

15. The method of claim 14 further comprising employing as said predetermined frequency one of 12.5 kHz, 25 kHz and 50 kHz; and
determining whether acoustic noise at about said predetermined frequency persists for greater than a predetermined time.

16. The method of claim 15 further comprising
employing as said predetermined time about 0.1 seconds.

17. The method of claim 12 further comprising
employing as said power circuit an alternating current power circuit; and
detecting said fault in said alternating current power circuit.

18. The method of claim 17 further comprising
determining a frequency of said power circuit or at least one harmonic or at least one sub-harmonic of said frequency;
band pass filtering said sensed acoustic signal to determine a filtered signal; and
determining if a summation of acoustic signal intensities at said frequency of said power circuit or said at least one harmonic or said at least one sub-harmonic exceeds a predetermined amount.

19. The method of claim 18 further comprising
determining an absolute value of said sensed acoustic signal; and
employing a fast Fourier transform of said absolute value to determine said frequency or said at least one harmonic or said at least one sub-harmonic.

20. The method of claim 18 further comprising
asserting a trip signal if said summation of acoustic signal intensities at said frequency of said power circuit or said at least one harmonic or said at least one sub-harmonic exceeds said predetermined amount; and
alternatively, discarding said sensed acoustic signal and re-sensing said acoustic signal.

21. The method of claim 17 further comprising
analyzing said sensed acoustic signal to detect acoustic wavelets and to determine duration of a half cycle of said current; and
determining if time durations measured between successive pairs of said acoustic wavelets during a predetermined time period match multiples of the duration of said half cycle of said current.

22. The method of claim 21 further comprising
determining said match and asserting a trip signal and, alternatively, discarding said sensed acoustic signal and re-sensing said acoustic signal.

23. The method of claim 17 further comprising
determining a frequency of said power circuit or at least one harmonic or at least one sub-harmonic of said frequency;
band pass filtering said sensed acoustic signal to determine a filtered signal;
determining if a summation of acoustic signal intensities at said frequency of said power circuit or said at least one harmonic or said at least one sub-harmonic exceeds a predetermined amount and responsively asserting a first signal;
analyzing said sensed acoustic signal to detect acoustic wavelets and to determine duration of a half cycle of said current;
determining if time durations measured between successive pairs of said acoustic wavelets during a predetermined time period match multiples of the duration of said half cycle and responsively asserting a second signal; and
asserting a trip signal responsive to said first signal or said second signal.

24. The method of claim 13 further comprising
outputting said trip signal to a trip mechanism to interrupt said fault.

25. The method of claim 20 further comprising
outputting said trip signal to a trip mechanism to interrupt said fault.

26. The method of claim 13 further comprising
producing an alarm from said trip signal.

27. The method of claim 12 further comprising
employing as said fault a glowing contact.

28. The method of claim 13 further comprising
employing as said fault an arc fault; and
ignoring acoustic noise activity during initiation of said arc fault.

* * * * *